United States Patent
Dudeck et al.

(10) Patent No.: US 7,933,155 B2
(45) Date of Patent: Apr. 26, 2011

(54) MEMORY DEVICE WITH REDUCED BUFFER CURRENT DURING POWER-DOWN MODE

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 328 days.

(21) Appl. No.: 12/161,818

(22) PCT Filed: Aug. 13, 2007

(86) PCT No.: PCT/US2007/075811
§ 371 (c)(1),
(2), (4) Date: Jul. 23, 2008

(87) PCT Pub. No.: WO2009/023024
PCT Pub. Date: Feb. 19, 2009

(65) Prior Publication Data
US 2010/0220534 A1 Sep. 2, 2010

(51) Int. Cl.
*G11C 7/10* (2006.01)
(52) U.S. Cl. .............. 365/189.05; 365/189.02; 365/201; 365/229; 365/230.08; 365/233.15

(58) Field of Classification Search .................. 365/201, 365/189.05, 189.02, 229, 230.08, 233.15
See application file for complete search history.

(56) References Cited

U.S. PATENT DOCUMENTS
| 6,058,063 | A | 5/2000 | Jang |
| 6,794,914 | B2 * | 9/2004 | Sani et al. ............... 327/202 |
| 2002/0191480 | A1 | 12/2002 | Matsumoto et al. |
| 2006/0279308 | A1 | 12/2006 | Ong |
| 2007/0147149 | A1 | 6/2007 | Yoon |

FOREIGN PATENT DOCUMENTS
WO PCT/US2007/075811  6/2008
* cited by examiner

*Primary Examiner* — Huan Hoang
*Assistant Examiner* — Kretelia Graham
(74) *Attorney, Agent, or Firm* — Ryan, Mason & Lewis, LLP

(57) ABSTRACT

A memory device comprises a memory array, at least one buffer coupled to the memory array, and test circuitry coupled to the buffer. The buffer comprises switching circuitry configured to multiplex first and second inputs of the buffer to a given output of the buffer based at least in part on a control signal generated by the test circuitry. The control signal is generated as a function of both a test signal indicative of a test mode of operation of the memory device and a power-down signal indicative of a power-down mode of operation of the memory device. The buffer further comprises current reduction circuitry responsive to the control signal for reducing an amount of current consumed by the buffer in the power-down mode of operation. The buffer may comprise an input data buffer or an address buffer of the memory device.

20 Claims, 4 Drawing Sheets

MEMORY DEVICE WITH REDUCED BUFFER CURRENT DURING POWER-DOWN MODE

FIELD OF THE INVENTION

The present invention relates generally to semiconductor memory devices, and more particularly to techniques for reducing buffer current in such devices during a power-down mode of operation.

BACKGROUND OF THE INVENTION

Semiconductor memory devices typically include a number of buffers, including input data buffers and address buffers. Also, such memory devices generally operate in at least two modes, including a normal or functional mode in which data is written to or read from memory cells in a memory array of the device, and a power-down mode, in which most of the memory circuitry is disabled or otherwise inactive.

In conventional practice, input data buffers and address buffers of a given memory device can draw significant current even when the given device is in a power-down mode. This is because such buffers are typically coupled to external data and address buses that remain active within a higher-level memory system even when the given memory device is in the power-down mode, and activity on the external data and address buses results in dynamic current being drawn by the input data buffers and address buffers.

Previous attempts to alleviate this problem have utilized combinational logic gates and an additional control signal to disable the input data buffers and address buffers when the memory device that includes those buffers enters a power-down mode. Unfortunately, this approach is deficient in that it unduly impacts the performance of the buffers when the device is in the functional mode. For example, buffers configured in this manner may require longer setup times, thereby reducing the speed at which the buffers can operate. Moreover, implementation of the combinational logic gates utilized in this approach generally requires a large number of transistors, which significantly increases the circuit area of the device. Finally, the control signal usually must be applied to logic gates associated with a large number of different buffers, and thus must be generated in a manner that allows it to drive heavy loads. A control signal of this type can be difficult to generate, requiring drive circuitry that consumes significant current and occupies a large amount of circuit area.

It is therefore apparent that a need exists for an improved approach to reducing dynamic current consumption by input data buffers and address buffers when a memory device is in its power-down mode, without negatively impacting the performance of these buffers when the device is in its functional mode.

SUMMARY OF THE INVENTION

The present invention in one or more illustrative embodiments provides techniques for reducing dynamic current consumed by input data buffers and address buffers in a memory device that is in a power-down mode of operation. These techniques utilize built-in self test (BIST) circuitry of the buffers to generate a control signal to disable the buffers during the power-down mode in a manner which does not impact the performance of the buffers in a functional mode of operation, and which does not significantly increase the circuit area or power consumption of the memory device.

In accordance with one aspect of the invention, a memory device comprises a memory array, at least one buffer coupled to the memory array, and test circuitry coupled to the buffer. The buffer comprises switching circuitry configured to multiplex first and second inputs of the buffer to a given output of the buffer based at least in part on a control signal generated by the test circuitry. The control signal is generated as a function of both a test signal indicative of a test mode of operation of the memory device and a power-down signal indicative of a power-down mode of operation of the memory device. The buffer further comprises current reduction circuitry responsive to the control signal for reducing an amount of current consumed by the buffer in the power-down mode of operation. The buffer may comprise an input data buffer or address buffer of the memory device.

In an illustrative embodiment, the test circuitry comprises built-in self-test circuitry of the memory device, and includes a first logic gate having first and second inputs for receiving the test signal and power-down signal, respectively, and a second logic gate having a first input for receiving an output of the first logic gate and a second input for receiving the power-down signal. The control signal may comprise an output of at least one of the first and second logic gates. The logic gates may comprise NAND gates or NOR gates.

The current reduction circuitry may comprise a field effect transistor having source and drain terminals coupled between a supply node of the buffer and the given output of the buffer, and a gate terminal which receives the control signal from the test circuitry. As a more specific example, the field effect transistor may comprise an N-type field effect transistor having source and drain terminals coupled between a ground terminal of the buffer and the given output of the buffer. As another example, the field effect transistor may comprise a P-type field effect transistor having source and drain terminals coupled between a VDD terminal of the buffer and the given output of the buffer.

A memory device in accordance with the invention may be implemented, for example, as a stand-alone memory device, such as a packaged integrated circuit, or as an embedded memory in a processor or other device.

DETAILED DESCRIPTION OF THE INVENTION

The invention will be illustrated herein in conjunction with exemplary semiconductor memory devices and associated input data buffers and address buffers. It should be understood, however, that the invention is more generally applicable to any semiconductor memory device, and may be implemented using buffer circuitry other than that specifically shown in conjunction with the illustrative embodiments.

Figure 1:
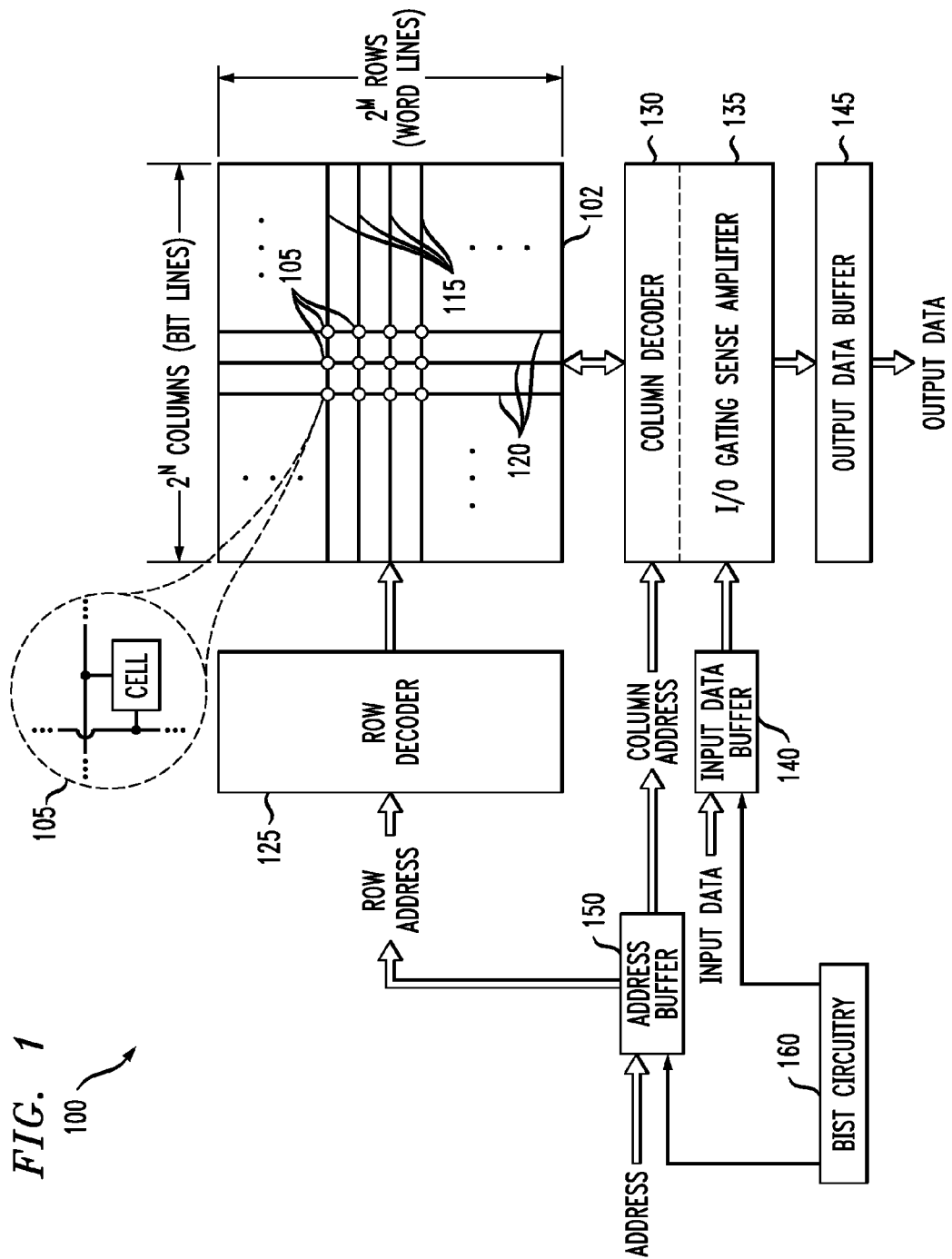
FIG. 1 shows a semiconductor memory device with an input data buffer and address buffer in an illustrative embodiment of the invention.

FIG. 1 shows a simplified diagram of a memory device 100 in accordance with an illustrative embodiment of the invention. The memory device 100 comprises a memory array 102 having a plurality of memory cells 105 configured to store data. The memory cells may each be configured to store a single bit of data, although other types of cells may be used in other embodiments. Each cell 105 is coupled to a corresponding row or wordline 115 and column or bitline 120. The memory array is illustratively shown as an array comprising cells arranged in $2^N$ columns and $2^M$ rows, although other arrangements are possible. Particular ones of the cells can be activated for reading or writing of data therefrom by application of appropriate row and column addresses to respective row decoder 125 and column decoder 130. Other elements of the memory device 100 include a gating and sense amplifier element 135, an input data buffer 140, an output data buffer 145 and an address buffer 150.

The input data buffer 140 stores data to be written to the array, while the output data buffer 145 stores data read from the array. The address buffer 150 stores the row and column addresses used in writing data to and reading data from the array. Numerous techniques for writing data to and reading data from a memory array such as array 102 are well understood in the art and such techniques will therefore not be described in detail herein.

Also included in the memory device 100 is built-in self-test (BIST) circuitry 160. The BIST circuitry in this embodiment is coupled to input data buffer 140 and address buffer 150 as shown. In the illustrative embodiments, the BIST circuitry generates a control signal as a function of both a test signal indicative of a test mode of operation of the memory device and a power-down signal indicative of a power-down mode of operation of the memory device. Examples of this type of control signal generation will be described in greater detail below in conjunction with FIGS. 3 and 4. The BIST circuitry may itself be viewed as an example of what is more generally referred to herein as "test circuitry." Such test circuitry may include conventional elements typically found in BIST circuitry or other types of test circuitry commonly implemented in memory devices, such as test signal generators, registers, etc.

Although memory array 102 is identified in FIG. 1 as comprising the cells 105 and their associated wordlines and bitlines 115 and 120, the term "memory array" as used herein is intended to be broadly construed, and may encompass one or more associated elements such as input or output data buffers, column or row decoders, gating elements, sense amplifiers, etc. For example, as described in PCT International Application No. PCT/US07/67502, filed Apr. 26, 2007 and entitled "Memory Device with Error Correction Capability and Efficient Partial Word Write Operation," which is commonly assigned herewith and incorporated by reference herein, a given implementation of memory array 102 may comprise local and global sense amplifiers, such that the gating and sense amplifier element 135 is distributed throughout the array rather than configured as a separate element as shown in FIG. 1.

It should be noted that the memory device 100 may comprise many types of stand-alone or embedded memory, including static or dynamic random access memory (SRAM or DRAM), electrically erasable programmable ROM (EEPROM), magnetic RAM (MRAM), ferroelectric RAM (FRAM), phase-change memory (PCRAM), etc. Also, as indicated previously, other types of memory cell configurations may be used. For example, the memory cells in the array 102 could be multi-level cells each configured to store more than one bit of data. The invention is thus not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. For example, the memory may include decode and correct circuitry for performing error detection and correction utilizing conventional error correction coding (ECC). These and other conventional elements, being well understood by those skilled in the art, are not described in detail herein. It should also be understood that the particular arrangement of elements shown in FIG. 1 is presented by way of illustrative example only. More specifically, as previously indicated, the invention can be implemented using many types of memory, and is not limited to any particular memory device configuration. Those skilled in the art will recognize that a wide variety of other memory device configurations may be used in implementing the invention.

As indicated previously, conventional input data buffers and address buffers are deficient in that when a memory device that incorporates such buffers goes into a power-down mode of operation, the buffers may still consume significant amounts of dynamic current. The illustrative embodiments overcome this deficiency of the prior art by configuring one or both of input data buffer 140 and address buffer 150 to incorporate power-down current reduction, using a control signal generated by the BIST circuitry 160. Advantageously, such current reduction is provided in a manner that does not adversely impact performance of the buffers in a functional mode of operation, and does not require significant additional circuitry.

Figure 2:
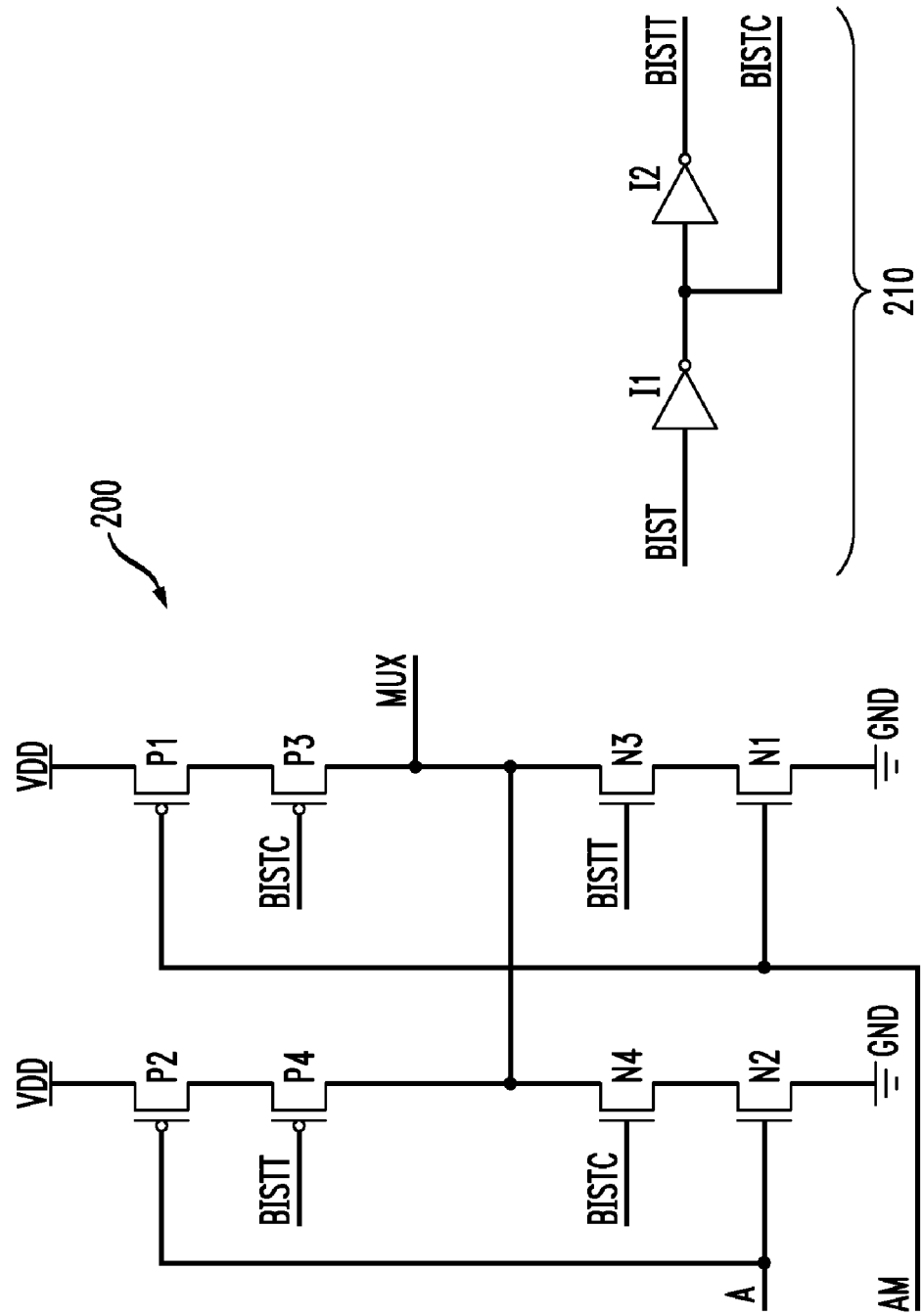
FIG. 2 shows portions of a given one of the input data and address buffers and associated test circuitry, as configured without power-down current reduction.

The illustrative embodiments utilize buffers that incorporate a multiplexing capability for supporting a test mode of operation, such as a BIST mode of operation. One example of such a buffer is buffer 200 as shown in FIG. 2. This buffer may be viewed as comprising a portion of the input data buffer 140 or the address buffer 150. Although only a portion of the buffer is shown for simplicity and clarity of description, a typical implementation will include multiple instances of such a portion, one for each separate functional mode input signal line that is multiplexed with a corresponding test mode input signal line.

Associated with the buffer 200 is a control signal generator 210 comprising inverters I1 and I2 connected in series as shown. In operation, the BIST signal applied to the input of inverter I1 is used to select between the functional mode and the BIST mode of the device. The output of the inverter I1 is applied as an input to the inverter I2. The output of the inverter I2 is a control signal BISTT, and its complement BISTC is present at the output of inverter I1. It should be noted that the term "control signal" as used herein is intended to be broadly construed, and may refer, by way of example, to a given signal, its complement, or both the given signal and its complement, as well as other sets of related signals, for example, a pair of signals that may be complementary in one mode of operation but not complementary in another mode of operation. Thus, in the FIG. 2 arrangement, the signal BISTT or its complement BISTC may each be viewed as a control signal, or both may be viewed as collectively comprising a control signal.

The buffer 200 includes switching circuitry that is configured to multiplex one of two buffer inputs A and AM to a given buffer output node MUX based at least in part on a control signal generated by the generator 210. The control signal generator 210 is assumed to be part of the BIST circuitry 160 in the present embodiments. It is assumed that input A is a normal data or address input used to supply an input data or address signal to the buffer in a functional mode of operation, while the input AM is a test data or address input used to supply a test data or address signal to the buffer in a test mode of operation.

In the FIG. 2 arrangement, the signal generator 210 generates, from the BIST signal which is indicative of the test mode of operation, a control signal comprising the signal BISTT and its complement BISTC. The switching circuitry of the buffer 200 includes N-type metal-oxide-semiconductor (NMOS) field effect transistors N1, N2, N3 and N4, and P-type MOS (PMOS) field effect transistors P1, P2, P3 and P4, arranged as shown. The BISTT signal is applied to the gates of N3 and P4, and its complement BISTC is applied to the gates of P3 and N4.

The BISTT signal and its complement BISTC control the multiplexing of buffer inputs A and AM to the buffer output node MUX. More particularly, in the functional mode of operation, the BIST signal is at a logic low level, such that the BISTT and BISTC signals are at logic low and logic high levels, respectively. Thus, transistors N3 and P3 are off, and transistors N4 and P4 are on, such that the normal input A is applied to the output node MUX via operation of transistors N2 and P2. Similarly, in the BIST mode of operation, the BIST signal is at a logic high level, such that the BISTT and BISTC signals are at logic high and logic low levels, respectively. Thus, transistors N3 and P3 are on, and transistors N4 and P4 are off, such that the test input AM is applied to the output node MUX via operation of transistors N1 and P1.

The arrangement shown in FIG. 2 does not include power-down current reduction. Thus, if the input signals A and AM are supplied via external data or address buses that remain active within a higher-level memory system even when the given memory device is in the power-down mode, activity on such external buses can result in an undesirable situation in which dynamic current is being drawn by the buffer 200.

Figure 3:
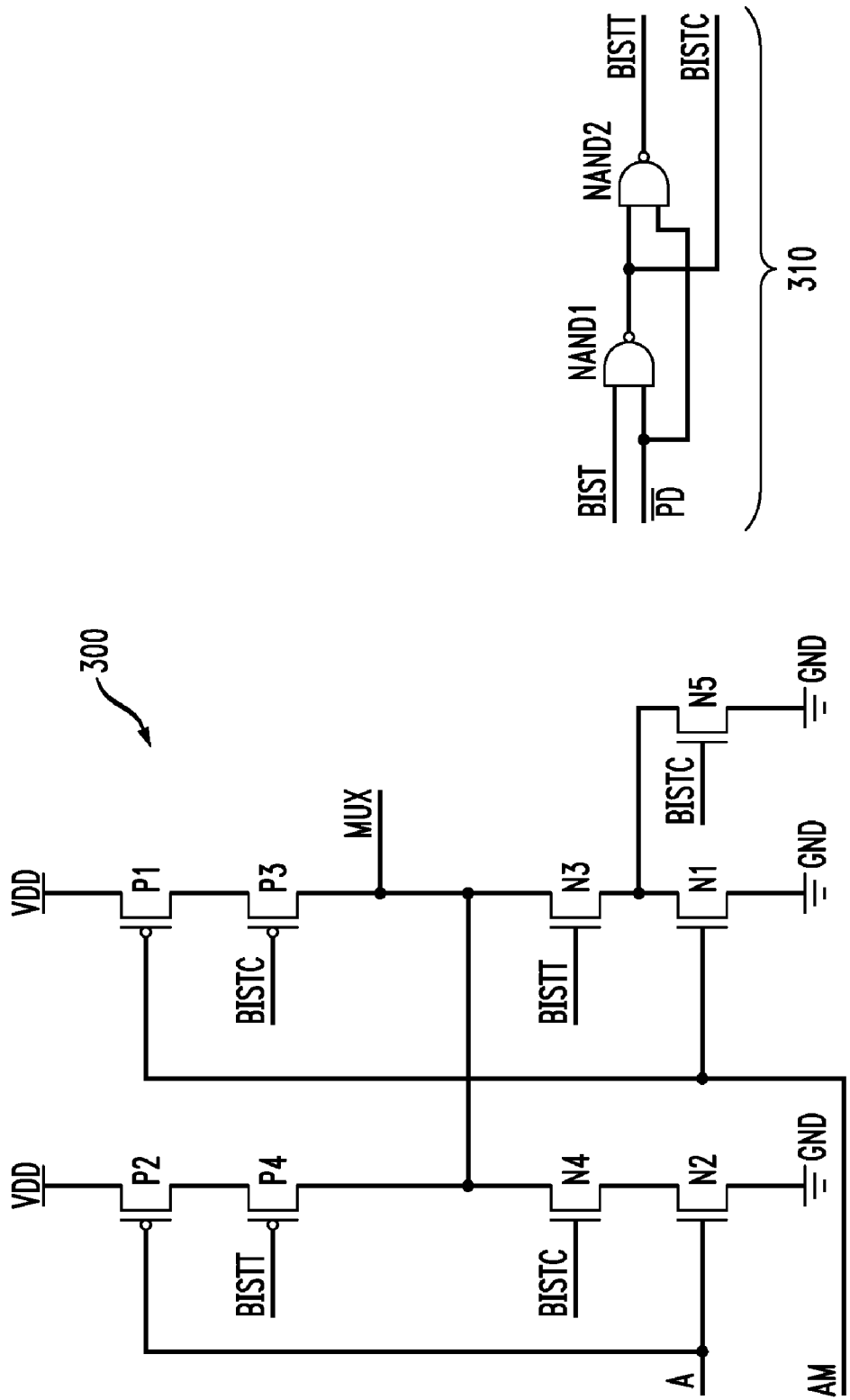
FIGS. 3 and 4 show portions of different embodiments of the FIG. 2 buffer and associated test circuitry, as configured to implement power-down current reduction.
Figure 4:
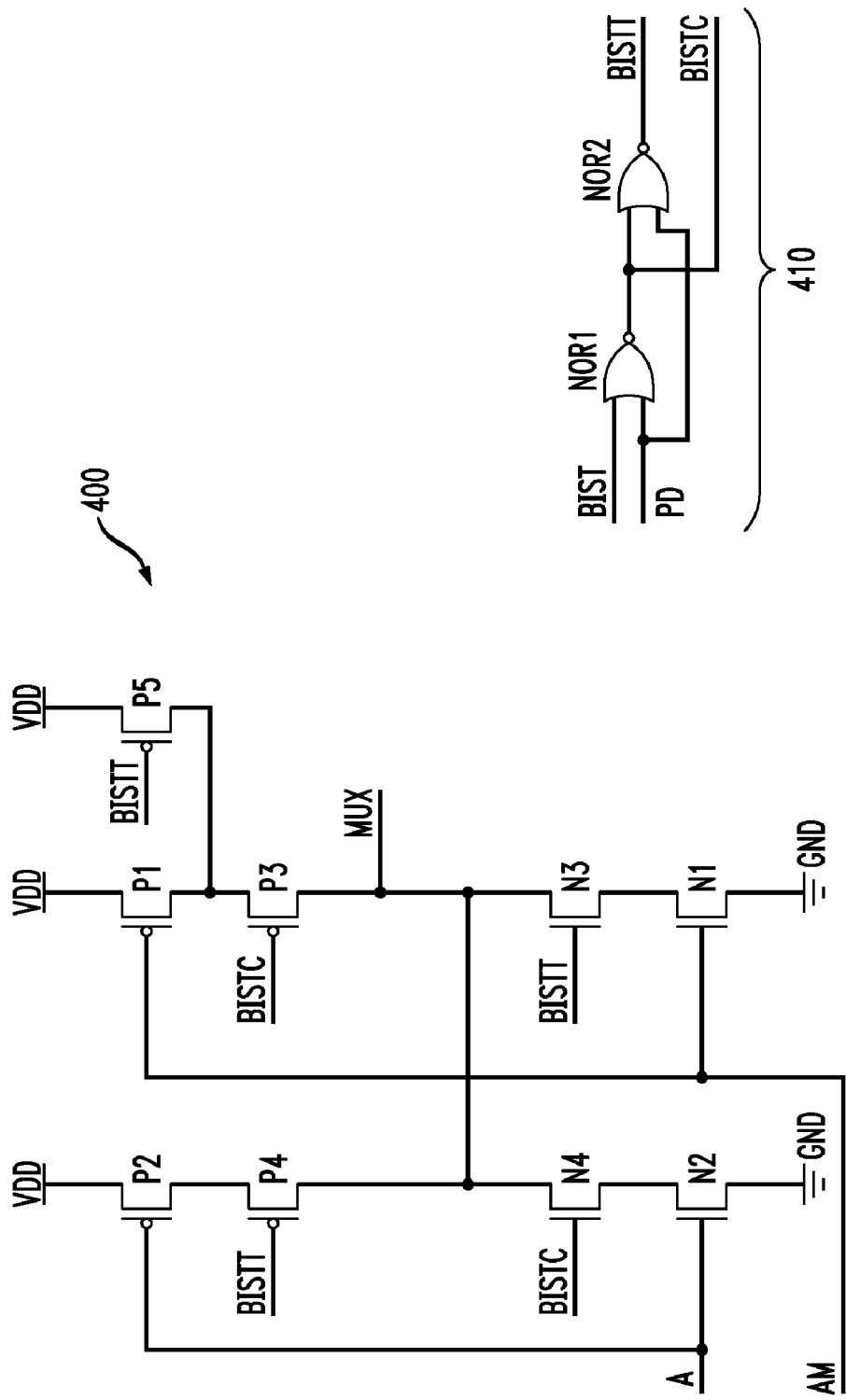

This problem is overcome in the illustrative embodiments of FIGS. 3 and 4 by configuring the control signal generator of the test circuitry such that the control signal is generated as a function of both a test signal indicative of a test mode of operation of the memory device and a power-down signal indicative of a power-down mode of operation of the memory device. In addition, the buffer is configured to include current reduction circuitry responsive to the control signal for reducing an amount of current consumed by the buffer in the power-down mode of operation. The current reduction circuitry, as will be seen, may be implemented using only a single additional transistor for each separate functional mode input signal line that is multiplexed with a corresponding test mode input signal line.

With reference initially to FIG. 3, the BIST circuitry 160 in this embodiment includes a control signal generator 310 comprising a pair of NAND gates denoted NAND1 and NAND2. The first gate NAND1 has first and second inputs for receiving the BIST signal and a power-down signal denoted PD-bar, respectively. The signal PD-bar is assumed to be the complement of a power-down signal denoted PD. The second gate NAND2 has a first input for receiving an output of the first gate NAND1 and a second input for receiving the power-down signal PD-bar. The control signal in this embodiment comprises the signal BISTC at the output of NAND1.

The buffer 300 includes transistors P1-P4 and N1-N4, inputs A and AM, and output node MUX all arranged as previously described in conjunction with FIG. 2. The circuit further includes current reduction circuitry comprising an additional NMOS transistor N5 connected in parallel with transistor N1. The gate of N5 receives the BISTC signal. The switching circuitry comprising transistors P1-P4 and N1-N4 is operative to multiplex the inputs A and AM of the buffer to the output node MUX using the signals BISTT and BISTC, and thus in a manner that is based at least in part on the control signal BISTC applied to the current reduction circuitry comprising the transistor N5.

In the power-down mode of operation, the signal PD-bar is at a logic low level, causing both the BISTT signal and the BISTC signal to go to a logic high level. Since both BISTT and BISTC are high, the output node MUX of buffer 300 is pulled low through transistors N3 and N5 and remains low during the power-down mode regardless of the logic levels of the inputs A and AM, or the BIST signal.

In the functional mode of operation, the signal PD-bar is at a logic high level, and the BIST signal is at a logic low level. Thus, the BISTT and BISTC signals are at logic low and logic high levels, respectively. The transistors N4 and P4 are on, as is the transistor N5. The transistors N3 and P3 are off, and thus transistor N5 does not affect the output node MUX. The addition of current reduction circuitry comprising transistor N5 thus has no impact on the performance of the buffer 300 in the functional mode of operation.

In the test mode of operation, the signal PD-bar is at a logic high level, and the BIST signal is at a logic high level. Thus, the BISTT and BISTC signals are at logic high and logic low levels, respectively. The transistors N3 and P3 are on. The transistors N4 and P4 are off, as is the transistor N5.

FIG. 4 shows another illustrative embodiment. The BIST circuitry 160 in this embodiment includes a control signal generator 410 comprising a pair of NOR gates denoted NOR1 and NOR2. The first gate NOR1 has first and second inputs for receiving the BIST signal and the power-down signal PD, respectively. The second gate NOR2 has a first input for receiving an output of the first gate NOR1 and a second input for receiving the power-down signal PD. The control signal in this embodiment comprises the signal BISTT at the output of NOR2.

The buffer 400 includes transistors P1-P4 and N1-N4, inputs A and AM, and output node MUX all arranged as previously described in conjunction with FIG. 2. The circuit further includes current reduction circuitry comprising an additional PMOS transistor P5 connected in parallel with transistor P1. The gate of P5 receives the BISTT signal. The switching circuitry comprising transistors P1-P4 and N1-N4 is operative to multiplex the inputs A and AM of the buffer to the output node MUX using the signals BISTT and BISTC, and thus in a manner that is based at least in part on the control signal BISTT applied to the current reduction circuitry comprising the transistor P5.

In the power-down mode of operation, the signal PD is at a logic high level, causing both the BISTT signal and the BISTC signal to go to a logic low level. Since both BISTT and BISTC are low, the output node MUX of buffer 400 is pulled high through transistors P3 and P5 and remains high during the power-down mode regardless of the logic levels of the inputs A and AM, or the BIST signal.

In the functional mode of operation, the signal PD is at a logic low level, and the BIST signal is at a logic low level. Thus, the BISTT and BISTC signals are at logic low and logic high levels, respectively. The transistors N4 and P4 are on, as is the transistor P5. The transistors N3 and P3 are off, and thus transistor P5 does not affect the output node MUX. The addition of current reduction circuitry comprising transistor P5 thus has no impact on the performance of the buffer 400 in the functional mode of operation.

In the test mode of operation, the signal PD is at a logic low level, and the BIST signal is at a logic high level. Thus, the BISTT and BISTC signals are at logic high and logic low levels, respectively. The transistors N3 and P3 are on. The transistors N4 and P4 are off, as is the transistor P5.

From the FIGS. 3 and 4 embodiments it is apparent that the MUX node of a given buffer can be set to a preferred state of logic high or logic low during the power-down mode of operation. For example, if it is desirable for a given buffered signal to have the corresponding MUX node at a logic high level during the power-down mode, the circuit of FIG. 4 would be implemented, and if it is desirable for some other buffered signal to have the corresponding MUX node at a logic low level during the power-down mode, the circuit of FIG. 3 would be implemented. Thus, a given memory device may utilize the FIG. 3 circuit for certain buffered signals and the FIG. 4 circuit for others, depending on the desired states of the MUX nodes during power-down mode. Such an approach enhances the flexibility of a design that utilizes chip select or chip enable signals, as such signals are typically in a deselect or disable state during the power-down mode. For example, by setting the MUX node of a given buffer to a particular state during power-down mode, all of the circuitry in the memory that is disabled by a chip enable signal could be made inactive without the need for any additional logic, control signals or transistors.

It is to be appreciated that the particular buffer and test circuitry arrangements shown in FIGS. 3 and 4 may be altered in other embodiments. Other types of switching circuitry and current reduction circuitry may be used. Also, other types of control signals and associated control signal generators, or more generally other test circuitry, may be used in implementing the invention.

As indicated previously, the above-noted embodiments are advantageous in that they significantly reduce the dynamic current drawn by input data buffers or address buffers in memory device that is in a power-down mode of operation. This advancement is achieved without impacting the functional mode performance of the buffer, and without the need for significant amounts of additional circuitry. A single MST circuit of the type shown at 310 or 410 can be used to drive buffers having multiple instances of the circuitry 300 or 400. The circuit area of the memory device is therefore not unduly increased.

A given memory device configured in accordance with the present invention may be implemented as a stand-alone memory device, for example, a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory of a microprocessor, central processing unit (CPU), digital signal processor (DSP), application-specific integrated circuit (ASIC), or other type of processor or integrated circuit device.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of memory arrays, buffer circuitry, switching circuitry, test circuitry, current reduction circuitry and associated logic and switching elements for implementing the described functionality. These and numerous other alternative embodiments within the scope of the following claims will be apparent to those skilled in the art.

What is claimed is:

1. A memory device comprising:
   a memory array;
   at least one buffer coupled to the memory array; and
   test circuitry coupled to the buffer;
   wherein the buffer comprises switching circuitry configured to multiplex first and second inputs of the buffer to a given output of the buffer based at least in part on a control signal generated by the test circuitry;
   wherein the control signal is generated as a function of both a test signal indicative of a test mode of operation of the memory device and a power-down signal indicative of a power-down mode of operation of the memory device; and
   wherein the buffer further comprises current reduction circuitry responsive to the control signal for reducing an amount of current consumed by said buffer in the power-down mode of operation.

2. The memory device of claim 1 wherein said buffer comprises an input data buffer.

3. The memory device of claim 1 wherein said buffer comprises an address buffer.

4. The memory device of claim 1 wherein said test circuitry comprises built-in self-test circuitry of the memory device.

5. The memory device of claim 1 wherein said test circuitry comprises a first logic gate having first and second inputs for receiving the test signal and power-down signal, respectively.

6. The memory device of claim 5 wherein said test circuitry further comprises a second logic gate having a first input for receiving an output of the first logic gate and a second input for receiving the power-down signal.

7. The memory device of claim 6 wherein the control signal comprises an output of at least one of the first and second logic gates.

8. The memory device of claim 6 wherein the first and second logic gates comprise NAND gates.

9. The memory device of claim 6 wherein the first and second logic gates comprise NOR gates.

10. The memory device of claim 1 wherein the current reduction circuitry comprises a field effect transistor having source and drain terminals coupled between a supply node of the buffer and the given output of the buffer, and a gate terminal which receives the control signal from the test circuitry.

11. The memory device of claim 10 wherein the source and drain terminals are coupled between a ground terminal of the buffer and the given output of the buffer.

12. The memory device of claim 10 wherein the source and drain terminals are coupled between a VDD terminal of the buffer and the given output of the buffer.

13. The memory device of claim 1 wherein the memory device comprises a stand-alone memory device.

14. The memory device of claim 1 wherein the memory device comprises an embedded memory device.

15. An integrated circuit comprising the memory device of claim 1.

16. A buffer for use in a memory device comprising a memory array and test circuitry, the buffer comprising:
   switching circuitry configured to multiplex first and second inputs of the buffer to a given output of the buffer based at least in part on a control signal generated by the test circuitry; and current reduction circuitry coupled to the switching circuitry and responsive to the control signal for reducing an amount of current consumed by the buffer in a power-down mode of operation of the memory device;

wherein the control signal is generated as a function of both a test signal indicative of a test mode of operation of the memory device and a power-down signal indicative of the power-down mode of operation.

17. An integrated circuit comprising the buffer of claim 16.

18. A method for use in a memory device comprising a buffer, a memory array and test circuitry, the method comprising the steps of:

multiplexing first and second inputs of the buffer to a given output of the buffer based at least in part on a control signal generated by the test circuitry, wherein the control signal is generated as a function of both a test signal indicative of a test mode of operation of the memory device and a power-down signal indicative of a power-down mode of operation of the memory device; and reducing an amount of current consumed by said buffer in the power-down mode of operation responsive to the control signal.

19. The method of claim 18 wherein the reducing step comprises changing a conduction state of a field effect transistor in said buffer, the field effect transistor having source and drain terminals coupled between a supply node of the buffer and the given output of the buffer, and a gate terminal which receives the control signal from the test circuitry.

20. A non-transitory computer-readable storage medium comprising executable program code for implementing the method of claim 18.

* * * * *